United States Patent
Higuchi et al.

(10) Patent No.: US 9,458,284 B2
(45) Date of Patent: Oct. 4, 2016

(54) CARBOXYL-CONTAINING RESIN, RESIN COMPOSITION FOR SOLDER MASK, AND METHOD OF PREPARING CARBOXYL-CONTAINING RESIN

(71) Applicant: GOO CHEMICAL CO., LTD., Kyoto (JP)

(72) Inventors: Michiya Higuchi, Kyoto (JP); Hisashi Marusawa, Kyoto (JP); Fumito Suzuki, Shiga (JP); Yoshio Sakai, Shiga (JP)

(73) Assignee: GOO CHEMICAL CO., LTD., Kyoto (JP)

( * ) Notice: Subject to any disclaimer, the term of this patent is extended or adjusted under 35 U.S.C. 154(b) by 0 days.

(21) Appl. No.: 14/357,827

(22) PCT Filed: Nov. 13, 2012

(86) PCT No.: PCT/JP2012/079351
§ 371 (c)(1),
(2) Date: May 13, 2014

(87) PCT Pub. No.: WO2013/073518
PCT Pub. Date: May 23, 2013

(65) Prior Publication Data
US 2014/0308613 A1    Oct. 16, 2014

(30) Foreign Application Priority Data
Nov. 15, 2011    (JP) ................. 2011-249746

(51) Int. Cl.
| | | |
|---|---|---|
| *G03F 7/038* | (2006.01) | |
| *C08G 59/17* | (2006.01) | |
| *C08G 59/14* | (2006.01) | |
| *G03F 7/027* | (2006.01) | |
| *C08G 59/42* | (2006.01) | |
| *C08L 63/04* | (2006.01) | |
| *H05K 3/28* | (2006.01) | |
| *H05K 3/34* | (2006.01) | |

(52) U.S. Cl.
CPC ........... *C08G 59/1466* (2013.01); *C08G 59/14* (2013.01); *C08G 59/42* (2013.01); *C08L 63/04* (2013.01); *G03F 7/027* (2013.01); *G03F 7/038* (2013.01); *G03F 7/0385* (2013.01); *G03F 7/0388* (2013.01); *H05K 3/287* (2013.01); *H05K 3/3452* (2013.01)

(58) Field of Classification Search
None
See application file for complete search history.

(56) References Cited

U.S. PATENT DOCUMENTS

| | | | | |
|---|---|---|---|---|
| 5,659,004 | A * | 8/1997 | Takigawa et al. | ............ 528/101 |
| 6,177,489 | B1 * | 1/2001 | Okuse et al. | ................ 523/451 |
| 2005/0064336 | A1 | 3/2005 | Miyabe | |
| 2006/0060824 | A1* | 3/2006 | Yasumura et al. | ............ 252/500 |
| 2006/0157872 | A1* | 7/2006 | Kotani et al. | ................ 257/787 |
| 2009/0042126 | A1* | 2/2009 | Tanaka et al. | ............ 430/280.1 |
| 2011/0082229 | A1* | 4/2011 | Ikegami et al. | ................ 522/68 |
| 2011/0089549 | A1* | 4/2011 | Zenbutsu et al. | ............ 257/676 |
| 2011/0117333 | A1* | 5/2011 | Furukawa | ................ 428/195.1 |

FOREIGN PATENT DOCUMENTS

| | | |
|---|---|---|
| EP | 1296188 A2 * | 3/2003 |
| JP | 9-211860 A | 8/1997 |
| JP | 2007-279489 A | 10/2007 |
| JP | 2007-328028 A | 12/2007 |
| JP | 2009-46604 A | 3/2009 |
| JP | 2009-145884 A | 7/2009 |
| JP | 2010-31072 A | 2/2010 |
| JP | 2011-99919 A | 5/2011 |
| JP | 2012-92307 A | 5/2012 |
| JP | 2012-226040 A | 11/2012 |
| WO | WO-2006/109890 A1 | 10/2006 |
| WO | WO-2008/050653 A1 | 5/2008 |
| WO | WO-2011/122027 A1 | 10/2011 |

OTHER PUBLICATIONS

International Search Report for Application No. PCT/JP2012/079351 mailed Feb. 5, 2013.
Miyajima, Hiroshi et al., "Properties of New Epoxy Resin Hardener HN-2200", Hitachihyoron, 1972, vol. 54, No. 4, pp. 49-54.
Supplementary European Search Report for the Application No. EP 12 84 9529 dated May 22, 2015.

* cited by examiner

*Primary Examiner* — Cynthia Hamilton
(74) *Attorney, Agent, or Firm* — Cheng Law Group, PLLC

(57) ABSTRACT

The carboxyl-containing resin in accordance with the present invention has a structure resulting from addition of a carboxylic acid to at least one of epoxy groups of a biphenyl novolac epoxy resin. The carboxylic acid includes at least a polybasic acid.

10 Claims, No Drawings

CARBOXYL-CONTAINING RESIN, RESIN COMPOSITION FOR SOLDER MASK, AND METHOD OF PREPARING CARBOXYL-CONTAINING RESIN

TECHNICAL FIELD

The present invention relates to: a carboxyl-containing resin to form a solder mask layer on a printed wiring board; a resin composition for a solder mask; and a method of preparing a carboxyl-containing resin.

BACKGROUND ART

In the past, various photosensitive resin compositions or various heat curable resin compositions have been used for forming a solder mask layer on a printed wiring board.

Recently, electronic devices have been required to be lighter, thinner, shorter and smaller, and therefore printed wiring boards has been required to have wires in a higher density. To meet these requirements, the solder mask layer is required to have high performance. That is, a resin composition for a solder mask layer is required to be less likely to gel and excellent in developability, and can be formed into an excellent solder mask layer having sufficient properties such as hardness, heat resistance, chemical resistance, electrical insulation reliability, flexibility, and toughness.

In view of the above circumstances, the applicants proposed a curable composition capable of being developed by alkaline developers as disclosed in Patent Literature 1. The curable composition contains: (A) a carboxyl-containing resin which has an acid value ranging from 20 to 200 mg KOH/g and is soluble to an organic solvent; (B) a carboxyl-containing compound; (C) a photosensitive (meth)acrylate compound; and (D) a photopolymerization initiator. The carboxyl-containing resin is prepared by reacting epoxy groups of a resin (a) which contains two or more epoxy groups per one molecule with 0.3 to 0.9 mol of one type or more of a monocarboxylic acid (b) in total per one equivalent of the epoxy groups of the resin to prepare a reaction product (c), and subsequently reacting epoxy groups of the reaction product (c) with 1.0 to 5.0 mol of a polybasic acid (d) per one equivalent of the epoxy groups of the reaction product. According to the invention disclosed in Patent Literature 1, there is provided the curable composition having sufficient developability for increasing a density of wires in a printed wiring board. Furthermore, the curable composition can form a cured film excellent in hardness, solder heat resistance, chemical resistance, adhesion, PCT resistance, electroless gold plating resistance, whitening resistance, electrical insulation reliability, and flexibility.

However, the composition described in Patent Literature 1 may gel at the time of curing, unfortunately, depending on a selection of raw materials and reaction conditions. Furthermore, in view of recent requirements to increase a density of wires in a printed wiring board, the solder mask layer is requested to have further improved electrical insulation reliability.

CITATION LIST

Patent Literature

Patent Literature 1: JP 2010-31072 A

SUMMARY OF INVENTION

Technical Problem

In view of the above circumstances, the present invention has been proposed and the object thereof is to provide: a carboxyl-containing resin which is less likely to gel and can form a solder mask layer with high electrical insulation reliability; a resin composition for a solder mask containing the carboxyl-containing resin; and a method of preparing the carboxyl-containing resin.

Solution to Problem

According to a first aspect of the present invention, there is provided a carboxyl-containing resin having a structure resulting from addition of a carboxylic acid to at least one of epoxy groups of a biphenyl novolac epoxy resin, the carboxylic acid including at least a polybasic acid.

According to a second aspect of the present invention, there is provided a carboxyl-containing resin having a structure resulting from addition of a polybasic acid to at least one of epoxy groups of a biphenyl novolac epoxy resin.

In other words, in the carboxyl-containing resin in accordance with the second aspect of the present invention, the carboxylic acid consists of the polybasic acid, the carboxyl-containing resin further being in accordance with the first aspect.

The carboxyl-containing resin in accordance with the present invention may have a structure resulting from addition of a monocarboxylic acid to one or more of epoxy groups of the biphenyl novolac epoxy resin and an addition of a polybasic acid to one or more of the other epoxy groups of the biphenyl novolac epoxy resin.

In other words, in the carboxyl-containing resin in accordance with a third aspect of the present invention, the carboxylic acid further includes a monocarboxylic acid, the carboxyl-containing resin further being in accordance with the first aspect.

In the carboxyl-containing resin in accordance with the present invention, the monocarboxylic acid may further include an ethylenically unsaturated group-containing monocarboxylic acid.

In other words, in the carboxyl-containing resin in accordance with a fourth aspect of the present invention, the monocarboxylic acid further includes an ethylenically unsaturated group-containing monocarboxylic acid, the carboxyl-containing resin further being in accordance with the third aspect.

A resin composition for a solder mask in accordance with the present invention contains the carboxyl-containing resin.

In other words, according to a fifth aspect of the present invention, there is provided a resin composition for a solder mask containing the carboxyl-containing resin in accordance with any one of the first to third aspects.

According to a sixth aspect of the present invention, there is provided a resin composition for a solder mask containing the carboxyl-containing resin in accordance with the fourth aspect.

The resin composition for a solder mask in accordance with the present invention may further contain a photopolymerization initiator.

In other words, according to a seventh aspect of the present invention, there is provided a resin composition for a solder mask further containing a photopolymerization initiator, the resin composition being in accordance with the sixth aspect.

The resin composition for a solder mask in accordance with the present invention may further contain at least one type of a photopolymerizable compound selected from a group consisting of a photopolymerizable monomer and a photopolymerizable prepolymer.

In other words, according to an eighth aspect of the present invention, there is provided a resin composition for a solder mask further containing at least one type of photopolymerizable compound selected from a group consisting of a photopolymerizable monomer and a photopolymerizable prepolymer, the resin composition being in accordance with the sixth or seventh aspect.

The resin composition for a solder mask in accordance with the present invention may further contain an epoxy compound having at least two epoxy groups per molecule.

In other words, according to a ninth aspect of the present invention, there is provided a resin composition for a solder mask further containing an epoxy compound having at least two epoxy groups per molecule, the resin composition being in accordance with any one of the fifth to eighth aspects.

According to a tenth aspect of the present invention, there is provided a method of preparing a carboxyl-containing resin including: preparing a biphenyl novolac epoxy resin; and adding a carboxylic acid including a polybasic acid to at least one of epoxy groups of the biphenyl novolac epoxy resin to produce the carboxyl-containing resin.

According to an eleventh aspect of the present invention, there is provided a method of preparing a carboxyl-containing resin, in which the carboxylic acid consists of the polybasic acid, the method being in accordance with the tenth aspect.

According to a twelfth aspect of the present invention, there is provided a method of preparing a carboxyl-containing resin, in which the carboxylic acid further includes a monocarboxylic acid, the method being in accordance with the tenth aspect.

Advantageous Effects of Invention

According to the present invention, it is possible to form a solder mask layer having a reduced risk of gelling in formation and high electrical insulation reliability.

DESCRIPTION OF EMBODIMENTS (1) Carboxyl-Containing Resin

A resin composition for a solder mask of the present embodiment contains the following carboxyl-containing resin as an essential component.

The carboxyl-containing resin has a structure resulting from addition of a polybasic acid to at least one of epoxy groups of a biphenyl novolac epoxy resin.

The carboxyl-containing resin may further have a structure resulting from addition of a monocarboxylic acid to one or more of the remaining epoxy groups of the biphenyl novolac epoxy resin. In other words, the carboxyl containing resin may have a structure resulting from addition of a monocarboxylic acid to one or more of epoxy groups of a biphenyl novolac epoxy resin and addition of a polybasic acid to one or more of the other epoxy groups.

In brief, the carboxyl-containing resin has a structure resulting from addition of a carboxylic acid to at least one of epoxy groups of the biphenyl novolac epoxy resin. The carboxylic acid includes at least the polybasic acid. The carboxylic acid may consist of a polybasic acid or may include a monocarboxylic acid in addition to the polybasic acid.

The carboxyl-containing resin may be: (1) a resin which has a structure resulting from addition of a polybasic acid to all the epoxy groups of the biphenyl novolac epoxy resin; (2) a resin which has a structure resulting from addition of a polybasic acid to one or more of epoxy groups of the biphenyl novolac epoxy resin and has remaining unreacted epoxy groups; (3) a resin which has a structure resulting from addition of a monocarboxylic acid to one or more of epoxy groups of the biphenyl novolac epoxy resin and addition of a polybasic acid to one or some of the other epoxy groups, and has no remaining unreacted epoxy group; or (4) a resin which has a structure resulting from addition of a monocarboxylic acid to one or more of epoxy groups of the biphenyl novolac epoxy resin and addition of a polybasic acid to one or more of the other epoxy groups, and has one or more remaining unreacted epoxy group.

The biphenyl novolac epoxy resin has a structure represented by the following Chemical Formula 1. In this regard, n in the formula represents an integer of 1 or more.

[Chemical Formula 1]

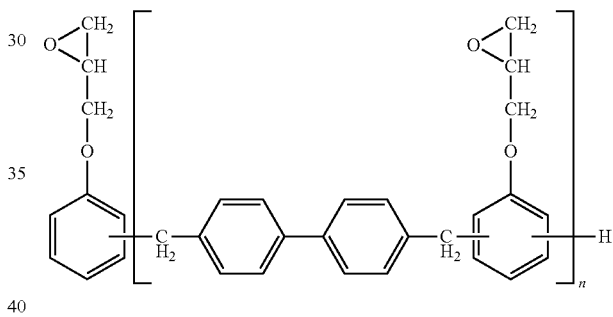

When the biphenyl novolac epoxy resin has the structure represented by the above Chemical Formula 1, the carboxyl-containing resin may have structural units represented by the following structural formulae (1), (2), and (3).

[Chemical Formula 2]

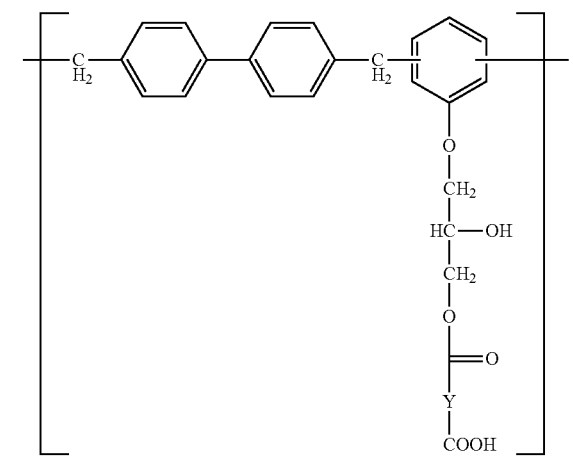

(1)

-continued

[Chemical Formula 3]

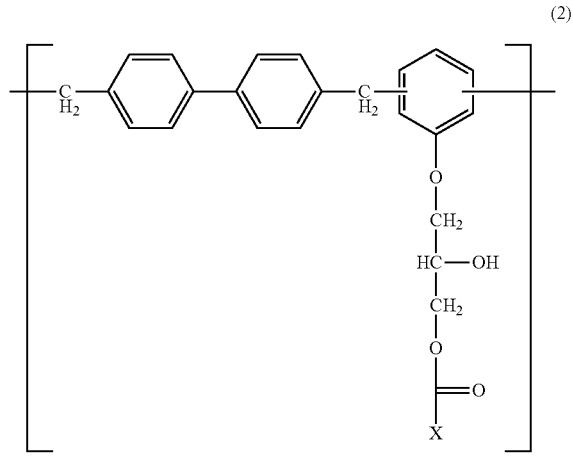

(2)

[Chemical Formula 4]

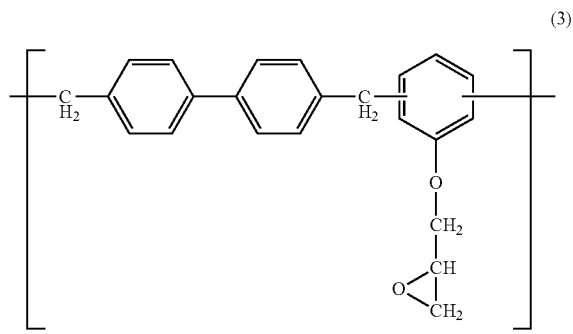

(3)

In the above formulae, X represents a monocarboxylic acid residue, and Y represents a polybasic acid residue.

The carboxyl-containing resin has the structural unit represented by the structural formula (1). The carboxyl-containing resin may further have either or both of the structural unit represented by the structural formula (2) and the structural unit represented by the structural formula (3).

The carboxyl containing resin may have only one type of the polybasic acid residue or two types or more.

When the carboxyl-containing resin has the monocarboxylic acid residue, the carboxyl-containing resin may have only one type of the monocarboxylic acid residue or two or more types of the monocarboxylic acid.

In a case where the carboxyl-containing resin has the monocarboxylic acid residue, the monocarboxylic acid residue may have an ethylenically unsaturated group or may not have. That is, the monocarboxylic acid used for preparing the carboxyl-containing resin may have an ethylenically unsaturated group or may not have. Particularly in a case where the carboxyl-containing resin has a monocarboxylic acid residue having an ethylenically unsaturated group, namely, in a case where a monocarboxylic acid having an ethylenically unsaturated group is used for preparing the carboxyl-containing resin, the resin composition for a solder mask which contains the carboxyl-containing resin can show photosensitivity (photo curability).

For the synthesis of the carboxyl-containing resin, the biphenyl novolac epoxy resin is prepared, for example. The carboxyl-containing resin may be prepared by adding the carboxylic acid which includes the polybasic acid to at least one of epoxy groups of the biphenyl novolac epoxy resin. For the synthesis, the carboxylic acid may include only the polybasic acid or may further include the monocarboxylic acid.

Examples of a synthetic method of the carboxyl-containing resin include the following four modes. The carboxyl-containing resin synthesized by any of these modes is particularly less likely to gel. Note that the synthetic method of the carboxyl-containing resin is not limited to these modes.

In the first mode of the synthetic method of the carboxyl-containing resin, a polybasic acid is added to one or more of epoxy groups of a biphenyl novolac epoxy resin to give the carboxyl-containing resin in an addition reaction between the biphenyl novolac epoxy resin and the polybasic acid.

In the second mode of the synthetic method of the carboxyl-containing resin, a monocarboxylic acid is added to one or more of epoxy groups of a biphenyl novolac epoxy resin to give an adduct (first intermediate) in an addition reaction between the biphenyl novolac epoxy resin and the monocarboxylic acid. Besides, a polybasic acid is added to one or some of the remaining epoxy groups of the first intermediate to give the carboxyl-containing resin in an addition reaction between the first intermediate and the polybasic acid.

In the third mode of the synthetic method of the carboxyl-containing resin, a monocarboxylic acid is added to one or more of epoxy groups of a biphenyl novolac epoxy resin to give an adduct (a second intermediate) in an addition reaction between the biphenyl novolac epoxy resin and the monocarboxylic acid. Besides, a monocarboxylic acid and a polybasic acid are added to the remaining epoxy groups of the second intermediate, respectively to give the carboxyl-containing resin in an addition reaction of the second intermediate with the monocarboxylic acid and the polybasic acid.

In the fourth mode of the synthetic method of the carboxyl-containing resin, a monocarboxylic acid is added to one or more of epoxy groups of a biphenyl novolac epoxy resin to give an adduct (a third intermediate) in an addition reaction between the biphenyl novolac epoxy resin and the monocarboxylic acid. Subsequently, a polybasic acid is added to one or more of the remaining epoxy groups of the third intermediate to give a fourth intermediate in an addition reaction between the third intermediate and the polybasic acid. Furthermore, a monocarboxylic acid is added to one or more of the remaining epoxy groups of the fourth intermediate to give the carboxyl-containing resin in an addition reaction between the fourth intermediate and the monocarboxylic acid.

The carboxyl-containing resin has a secondary alcoholic hydroxyl group at a side chain thereof, and therefore the resin composition for a solder mask can show excellent developing properties for a developer of an alkaline solution. Furthermore, the carboxyl-containing resin has a carboxyl group at an end of the side chain, and therefore is excellent in reactivity. Besides, in a case where the carboxyl-containing resin has the monocarboxylic acid residue having an ethylenically unsaturated group, the carboxyl-containing resin has the ethylenically unsaturated group at the end of the side chain, and therefore is excellent in reactivity.

Examples of the monocarboxylic acid used for preparing the carboxyl-containing resin include: an unsaturated group-containing monocarboxylic acid such as acrylic acid, methacrylic acid, crotonic acid, cinnamic acid, α-cyano-cinnamic acid, β-styrylacrylic acid, β-furfuryl acrylic acid, and ω-carboxy-polycaprolactone monoacrylate; a saturated aliphatic monocarboxylic acid such as formic acid, acetic acid, propionic acid, n-butyric acid, isobutyric acid, valeric acid, trimethyl acetic acid, capronic acid, caprylic acid, pelargonic acid, capric acid, undecylic acid, lauric acid, tridecylic acid, myristic acid, pentadecylic acid, palmitic acid, heptadecanoic acid, stearic acid, nonadecanoic acid, arachidic acid, and behenic acid; and an aromatic monocarboxylic acid such as benzoic acid, alkyl-substituted benzoic acid, alkyl-substituted and amino-substituted benzoic acid, halogenated benzoic acid, phenylacetic acid, anisic acid, benzoyl benzoic acid, and naphthoic acid. One type of these monocarboxylic acids may be used alone, or two or more types may be used with mixed. Particularly preferred are acrylic acid, methacrylic acid, and acetic acid.

Examples of the polybasic acid used for preparing the carboxyl-containing resin include oxalic acid, malonic acid, succinic acid, glutaric acid, adipic acid, pimelic acid, suberic acid, azelaic acid, sebacic acid, maleic acid, fumaric acid, phthalic acid, isophthalic acid, terephthalic acid, tetrahydrophthalic acid, methanetricarboxylic acid, tricarballylic acid, benzenetricarboxylic acid, and benzenetetracarboxylic acid. One of these compounds may be used alone, or two or more may be used with mixed. Out of these, preferred is a dicarboxylic acid soluble to a reaction solvent and/or soluble to a solvent at a reaction temperature. More preferred are malonic acid, glutaric acid, maleic acid, tetrahydrophthalic acid, and phthalic acid. Particularly preferred are maleic acid, tetrahydrophthalic acid, and phthalic acid.

In the first mode of the synthetic method of the carboxyl-containing resin, the addition reaction between the biphenyl novolac epoxy resin and the polybasic acid is preferably conducted in the presence of a polymerization inhibitor and a catalyst in a solvent. In this case, a proportion of the monocarboxylic acid supplied to the reaction system to one equivalent of the epoxy group of the biphenyl novolac epoxy resin preferably falls within a range of 0.15 to 3.0 mol, and more preferably falls within a range of 0.4 to 1.5 mol. With the proportion falling within any of the ranges, gelation is less likely to occur in synthesis of the carboxyl-containing resin, and when the resin composition for a solder mask is photosensitive, the developing properties thereof are improved in particular. The reaction temperature preferably falls within a range of 50° C. to 150° C., and more preferably falls within a range of 70° C. to 120° C.

Examples of the solvent used in the addition reaction, include: ketones such as methyl ethyl ketone and cyclohexanone; and aromatic hydrocarbons such as toluene, xylene, and tetramethyl benzene; and glycol ethers such as ethylene glycol monoethyl ether, ethylene glycol monomethyl ether, ethylene glycol monobutyl ether, diethylene glycol monoethyl ether, diethylene glycol monomethyl ether, diethylene glycol monobutyl ether, propylene glycol monomethyl ether, propylene glycol monoethyl ether, dipropylene glycol diethyl ether, and triethylene glycol monoethyl ether; and esters of acetic acid such as ethyl acetate, butyl acetate, ethylene glycol monoethyl ether acetate, ethylene glycol monobutyl ether acetate, diethylene glycol monoethyl ether acetate, diethylene glycol monobutyl ether acetate, propylene glycol monomethyl ether acetate, and dipropylene glycol monomethyl ether acetate; and alcohols such as ethanol, propanol, ethylene glycol, and propylene glycol; and aliphatic hydrocarbons such as octane and decane; and petroleum-based solvents such as petroleum ether, petroleum naphtha, hydrogenated petroleum naphtha, and solvent naphtha. Only one type of these organic solvents may be used, or two or more types may be used together.

Examples of the catalyst include: tertiary amines such as triethylamine; quaternary ammonium salts such as triethylbenzylammonium chloride; imidazole compounds such as 2-ethyl-4-methylimidazole; phosphorus compounds such as triphenylphosphine; and a metal salt of an organic acid such as metal salts of naphtenic acid, lauric acid, stearic acid, oleic acid, and octoenoic acid, examples of the metal including lithium, chromium, zirconium, potassium, and sodium. However, the catalyst is not limited to the above examples. Only one type of these catalysts may be used alone, or two or more types may be used together.

Examples of the polymerization inhibitor include hydroquinone, methylhydroquinone, hydroquinone monomethyl ether, catechol, pyrogallol, and phenothiazine. However, the polymerization inhibitor is not limited to them. Only one type of these polymerization inhibitors may be used, or two or more types may be used together.

In the second to fourth modes of the synthetic method of the carboxyl-containing resin, the addition reaction between the biphenyl novolac epoxy resin and the monocarboxylic acid is preferably conducted in the presence of a polymerization inhibitor and a catalyst in a solvent. In this case, a proportion of the monocarboxylic acid supplied to the reaction system to one equivalent of epoxy groups of the biphenyl novolac epoxy resin preferably falls within a range of 0.05 to 1.5 mol, and more preferably falls within a range of 0.1 to 0.7 mol. With the proportion falling within any of the ranges, gelation is less likely to occur in synthesis of the carboxyl-containing resin, and when the carboxyl-containing resin is photosensitive, the developing properties thereof are improved in particular. Note that this proportion regarding the monocarboxylic acid is not a proportion regarding a monocarboxylic acid which actually reacts with the epoxy groups but a proportion regarding the monocarboxylic acid which is supplied to the reaction system, and therefore the proportion may exceed one. The reaction temperature preferably falls within a range of 50° C. to 150° C., and more preferably falls within a range of 70° C. to 120° C.

Examples of the solvent used in the addition reaction, include: ketones such as methyl ethyl ketone and cyclohexanone; and aromatic hydrocarbons such as toluene, xylene, and tetramethyl benzene; and glycol ethers such as ethylene glycol monoethyl ether, ethylene glycol monomethyl ether, ethylene glycol monobutyl ether, diethylene glycol monoethyl ether, diethylene glycol monomethyl ether, diethylene glycol monobutyl ether, propylene glycol monomethyl ether, propylene glycol monoethyl ether, dipropylene glycol diethyl ether, and triethylene glycol monoethyl ether; and esters of acetic acid such as ethyl acetate, butyl acetate, ethylene glycol monoethyl ether acetate, ethylene glycol monobutyl ether acetate, diethylene glycol monoethyl ether acetate, diethylene glycol monobutyl ether acetate, propylene glycol monomethyl ether acetate, and dipropylene glycol monomethyl ether acetate; and alcohols such as ethanol, propanol, ethylene glycol, and propylene glycol; and aliphatic hydrocarbons such as octane and decane; and petroleum-based solvents such as petroleum ether, petroleum naphtha, hydrogenated petroleum naphtha, and solvent naphtha. Only one type of these organic solvents may be used, or two or more types may be used together.

Examples of the catalyst include: tertiary amines such as triethylamine; and quaternary ammonium salts such as triethylbenzylammonium chloride; and imidazole compounds such as 2-ethyl-4-methylimidazole; and phosphorus compounds such as triphenylphosphine; and a metal salt of an organic acid such as metal salts of naphtenic acid, lauric acid, stearic acid, oleic acid, and octoenoic acid, examples of the metal including lithium, chromium, zirconium, potassium, and sodium. However, the catalyst is not limited to the above examples. Only one type of these catalysts may be used alone, or two or more types may be used together.

Examples of the polymerization inhibitor include hydroquinone, methylhydroquinone, hydroquinone monomethyl ether, catechol, pyrogallol, and phenothiazine. However, the polymerization inhibitor is not limited to them. Only one type of these polymerization inhibitors may be used, and two or more types may be used together.

In the second mode of the synthetic method of the carboxyl-containing resin, the addition reaction between the adduct (the first intermediate) and the polybasic acid is preferably conducted in the presence of a polymerization inhibitor and a catalyst in a solvent. Under the conditions, a proportion of the polybasic acid supplied to the reaction system to one equivalent of the remaining epoxy group in the adduct preferably falls within a range of 0.15 to 3.0 mol, and more preferably falls within a range of 0.5 to 1.5 mol. Under these conditions, cross-linking between adducts is suppressed, and therefore gelation of the carboxyl-containing resin is suppressed and polybasic acid is less likely to remain unreacted. The reaction temperature preferably falls within a range of 50° C. to 150° C., and more preferably falls within a range of 70° C. to 120° C. Examples of the polymerization inhibitor and the catalyst for the addition reaction between the adduct and the polybasic acid are the same as those for the addition reaction between the biphenyl novolac epoxy resin and the monocarboxylic acid, respectively.

In the third mode of the synthetic method of the carboxyl-containing resin, the addition reaction of the adduct (the second intermediate) with the monocarboxylic acid and the polybasic acid is preferably conducted in the presence of a polymerization inhibitor and a catalyst in a solvent. Under these conditions, a proportion of the monocarboxylic acid supplied to the reaction system to one equivalent of the remaining epoxy group in the adduct preferably falls within a range of 0.15 to 5.0 mol, and more preferably falls within a range of 0.5 to 2.0 mol. Moreover, a proportion of the polybasic acid supplied to the reaction system to one equivalent of the remaining epoxy group in the adduct preferably falls within a range of 0.15 to 3.0 mol, and more preferably falls within a range of 0.5 to 1.5 mol. Under these conditions, cross-linking between adducts is suppressed, and therefore gelation of the carboxyl-containing resin is suppressed and polybasic acid is less likely to remain unreacted. The reaction temperature preferably falls within a range of 50° C. to 150° C., and more preferably falls within a range of 70° C. to 120° C. Examples of the polymerization inhibitor and the catalyst for the addition reaction between the adduct and the polybasic acid are the same as those for the addition reaction between the biphenyl novolac epoxy resin and the monocarboxylic acid, respectively.

In the fourth mode of the synthetic method of the carboxyl-containing resin, the addition reaction between the adduct (the third intermediate) and the polybasic acid is preferably conducted in the presence of a polymerization inhibitor and a catalyst in a solvent. Under the conditions, a proportion of the polybasic acid supplied to the reaction system to one equivalent of the remaining epoxy group in the adduct preferably falls within a range of 0.15 to 0.95 mol, and more preferably falls within a range of 0.5 to 0.9 mol. Furthermore, in the fourth mode, the addition reaction between the fourth intermediate and the monocarboxylic acid is preferably conducted in the presence of a polymerization inhibitor and a catalyst in a solvent. Under the conditions, a proportion of the monocarboxylic acid supplied to the reaction system in one equivalent of the remaining epoxy group in the fourth intermediate preferably falls within a range of 1.0 to 5.0 mol, and more preferably falls within a range of 1.01 to 2.0 mol. Under these conditions, cross-linking between the adducts is suppressed, and therefore gelation of the carboxyl-containing resin is suppressed and unreacted polybasic acid is less likely to remain. The reaction temperature preferably falls within a range of 50° C. to 150° C., and more preferably falls within a range of 70° C. to 120° C. Examples of the polymerization inhibitor and the catalyst for the addition reaction between the adduct and the polybasic acid are the same as those for the addition reaction between the biphenyl novolac epoxy resin and the monocarboxylic acid, respectively.

The acid value of the carboxyl-containing resin preferably falls within a range of 20 to 200 mg KOH/g, and more preferably 33 to 150 mg KOH/g. The carboxyl-containing resin having the acid value within any of the ranges can show various excellent properties in addition to excellent developing properties.

The molecular weight of the carboxyl-containing resin is not particularly limited, but the weight average molecular weight of the carboxyl-containing resin preferably falls within a range of 2,000 to 15,000. In this regard, the weight average molecular weight may be measured by means of gel permeation chromatography under the following conditions.

GPC apparatus: SHODEX SYSTEM 11 available from SHOWA DENKO K.K.

Column: SHODEX KF-800P, KF-005, KF-003, and KF-001, the four being connected in series.

Mobile phase: THF

Flow rate: 1 mL/min

Column temperature: 45° C.

Detector: RI

Polystyrene Equivalent

Such a carboxyl-containing resin is less likely to gel in synthesis thereof from the biphenyl novolac epoxy resin, the monocarboxylic acid, the polybasic acid, and the like. Hence, gelation of the resin composition for a solder mask is suppressed.

Besides, the solder mask layer made of the resin composition for a solder mask containing such a carboxyl-containing resin can have the improved electrical insulation reliability. The reason is not clearly understood, but we assume that the improvement of the electrical insulation reliability may relate to improvement of the water resistance of the solder mask layer caused by the carboxyl-containing resin which contains a biphenyl novolac structure.

Furthermore, in a case where the resin composition for a solder mask is photosensitive, such a photosensitive carboxyl-containing resin provides improvement of resolution of the resin composition for a solder mask, and therefore it is facilitated to form the solder mask layer with a fine pattern. The reason is not clearly understood, but this seems to be that scattering of light used in exposure for forming the solder mask layer is suppressed because a biphenyl skeleton per se absorbs light such as ultraviolet rays.

(2) Epoxy Resin

The resin composition for a solder mask preferably contains an epoxy compound having at least two epoxy groups per molecule. The resin composition containing the epoxy compound may be provided with heat curable properties. The epoxy compound may be an epoxy compound that is hardly soluble to a solvent, a versatile epoxy compound that is soluble to a solvent, or the like. A type of the epoxy compound is not particularly limited. Preferred examples of the epoxy resin include: phenol novolac epoxy resin (e.g., EPICLON N-775 (trade name) available from DIC Corporation); cresol novolac epoxy resin (e.g., EPICLON N-695 (trade name) available from DIC Corporation); bisphenol A epoxy resin (e.g., jER1001 (trade name) available from Mitsubishi Chemical Corporation); bisphenol A novolac epoxy resin (e.g., EPICLON N-865 (trade name) available from DIC Corporation); bisphenol F epoxy resin (e.g., jER4004P (trade name) available from Mitsubishi Chemical Corporation); bisphenol S epoxy resin (e.g., EPICLON EXA-1514 (trade name) available from DIC Corporation); bisphenol AD epoxy resin; biphenyl type epoxy resin (e.g., YX4000 (trade name) available from Mitsubishi Chemical Corporation); biphenyl novolac epoxy resin (e.g., NC-3000 (trade name) available from NIPPON KAYAKU CO., Ltd.); hydrogenated bisphenol A epoxy resin (e.g., ST-4000 D (trade name) available from NIPPON STEEL CHEMICAL CO., LTD.); naphthalene epoxy resin (e.g., EPICLON HP-4032, EPICLON HP-4700, and EPICLON HP-4770 (all trade names) available from DIC Corporation); specialized bifunctional epoxy resin (e.g., YL7175-500 and YL7175-1000 (trade names) available from Mitsubishi Chemical Corporation, EPICLON TSR-960, EPICLON TER-601, EPICLON TSR-250-80BX, EPICLON 1650-75MPX, EPICLON EXA-4850, EPICLON EXA-4816, EPICLON EXA-4822, and EPICLON EXA-9726 (trade names) available from DIC Corporation, and YSLV-120TE (trade name) available from NIPPON STEEL CHEMICAL CO., LTD.); and bisphenol type epoxy resin other than those described above. As triglycidyl isocyanurate, particularly preferred is a β-type triglycidyl isocyanurate that has a structure of three epoxy groups aligned in the same direction with respect to a S-triazine ring skeleton face, or a mixture of the β-type triglycidyl isocyanurate and an α-type triglycidyl isocyanurate that has a structure where one epoxy group is connected to the S-triazine ring skeleton face in a different direction from a direction in which the other two epoxy groups are connected to the S-triazine ring skeleton face.

The epoxy compound preferably contains a phosphorus containing epoxy resin. In this case, flame retardancy of a cured product of the resin composition for a solder mask is improved. Examples of the phosphorus containing epoxy resin include phosphorus acid modified bisphenol F epoxy resins (e.g., EPICLON EXA-9726 and EPICLON EXA-9710 (trade names) available from DIC Corporation) and EPOTHOTO FX-305 (trade name) available from NIPPON STEEL CHEMICAL CO., LTD.

A percentage of the epoxy compound in the resin composition for a solder mask is not particularly limited. However, when the resin composition for a solder mask is photosensitive and heat curable, a percentage of a total content of the epoxy compound in the total solid content of the resin composition for a solder mask preferably falls within a range of 0.1 to 50 mass %. When the resin composition for a solder mask is not heat curable but is not photosensitive, the percentage of the epoxy compound in the total solid content of the resin composition for a solder mask preferably falls within a range of 0.1 to 70 mass %.

Note that, as long as the resin composition for a solder mask is photosensitive, the resin composition for a solder mask is not necessarily heat curable. When the resin composition for a solder mask is not heat curable, the resin composition for a solder mask does not necessarily contain the epoxy compound.

(3) Photopolymerization Initiator

The resin composition for a solder mask may contain a photopolymerization initiator. When the resin composition for a solder mask contains the photopolymerization initiator, the resin composition for a solder mask is provided with photosensitive properties. When the resin composition for a solder mask contains the epoxy compound and the photopolymerization initiator, the resin composition for a solder mask is provided with both of heat curable and photosensitive properties.

Examples of the photopolymerization initiator include benzoin and alkyl ethers thereof; acetophenones such as acetophenone and benzyl dimethyl ketal; anthraquinones such as 2-methyl anthraquinone; thioxanthones such as 2,4-dimethyl thioxanthone, 2,4-diethyl thioxanthone, 2-isopropyl thioxanthone, 4-isopropyl thioxanthone, and 2,4-diisopropyl thioxanthone; benzophenones such as benzophenone and 4-benzoyl-4'-methyldiphenylsulfide; xanthones such as 2,4-diisopropylxanthone; α-hydroxy ketones such as 2-hydroxy-2-methyl-1-phenyl-propane-1-one; a nitrogen containing compound such as 2-methyl-1-[4-(methylthio)phenyl]-2-morpholino-1-propanone; acyl phosphine oxide-based photopolymerization initiators such as 2,4,6-trimethylbenzoyl-diphenyl-phosphine oxide (DAROCUR TPO), 2,4,6-trimethylbenzoyl-ethyl-phenyl-phosphinate (SPEEDCURE TPO-L), bis(2,4,6-trimethylbenzoyl)-phenylphosphine oxide (IRGACURE 819), and bis(2,6-dimethoxybenzoyl)-2,4,4-trimethyl-pentylphosphine oxide (CGI 403); and an oxime ester compound such as 1,2-octanedione, 1-[4-phenythio-2-(O-benzoyloxime)] (IRGACURE OXE 01), and ethanone, 1-[9-ethyl-6-(2-methylbenzoyl) 9H-carbazol-3-yl]-1-(O-acetyl oxime) (IRGACURE OXE 02). Together with the photopolymerization initiator, used may be a known photopolymerization promoter and a known sensitizer and the like such as p-dimethyl-benzoic acid ethyl ester and tertiary amines (e.g., p-dimethylamino-benzoic acid isoamyl ester, and 2-dimethylamino ethylbenzoate). A photopolymerization initiator for exposure of visible light or near infrared light may be used as requested. One type of these photopolymerization initiators may be used alone, or two or more types of those may be used together. A sensitizer used for laser exposure such as coumarin derivatives (e.g., 7-diethylamino-4-methylcoumarin), a carbocyanine dye type sensitizer, and a xanthene dye type sensitizer may be used as a sensitizer, together with the photopolymerization initiator.

When the photopolymerization initiator includes the acyl phosphine oxide-based photopolymerization initiator, the photopolymerization initiator preferably further includes α-hydroxy acetophenone. α-Hydroxy acetophenone is less susceptible to oxygen inhibition than the acyl phosphine oxide-based photopolymerization initiator is, and is less likely to tarnish by heat. Therefore, when α-hydroxy acetophenone is used, curability of an outer face of the resin composition for a solder mask at exposure of light is highly improved. Examples of the α-hydroxy acetophenone include 1-hydroxy-cyclohexyl-phenyl-ketone (IRGACURE 184), 2-hydroxy-2-methyl-1-phenyl-propane-1-one (DAROCUR 1173), and 1-[4-(2-hydroxyethoxy)-phenyl]-2-hydroxy-2-methyl-1-propane-1-one (IRGACURE 2959).

When the resin composition for a solder mask contains the acyl phosphine oxide-based photopolymerization initiator and α-hydroxy acetophenone, a percentage of the acyl phosphine oxide-based photopolymerization initiator in the resin composition for a solder mask preferably falls within a range of 0.1 to 20 mass %, and a percentage of the α-hydroxy acetophenone in the resin composition for a solder mask preferably falls within a range of 0.1 to 20 mass %. In this case, photosensitive properties of the resin composition for a solder mask are sufficiently retained, hardness of the cured product is further improved, and resistance of the cured product to developers is improved. Therefore, resistance to electroless nickel-plating of the cured product is particularly improved.

A preferred percentage of the photopolymerization initiator in the resin composition for a solder mask is selected appropriately in view of a balance between photosensitive properties of the resin composition for a solder mask and physical properties of the cured product made of the resin composition for a solder mask. Particularly, the percentage of the photopolymerization initiator preferably falls within a range of 0.1 to 30 mass %, based on the total solid content of the resin composition for a solder mask.

Note that, as long as the resin composition for a solder mask is heat curable, the resin composition for a solder mask is not necessarily photosensitive. When the resin composition for a solder mask is not photosensitive, the resin composition for a solder mask does not necessarily contain the photopolymerization initiator.

(4) Photopolymerizable Compound

In a case where the resin composition for a solder mask contains the photopolymerization initiator, it is preferable that the resin composition for a solder mask further contains a photopolymerizable compound in addition to the carboxyl-containing resin.

The photopolymerizable compound may be selected from a photopolymerizable monomer and a photopolymerizable prepolymer. The photopolymerizable compound is used for the purpose of dilution of the resin composition for a solder mask and adjustment of viscosity, an acid value, and photopolymerization properties, for example.

The photopolymerizable compound may be an appropriate photopolymerizable monomer or photopolymerizable prepolymer. Examples of the photopolymerizable compound include: monofunctional acrylate such as 2-hydroxy ethyl acrylate; polyfunctional (meth)acrylate such as diethylene glycol di(meth)acrylate, trimethylolpropane di(meth)acrylate, trimethylolpropane tri(meth)acrylate, pentaerythritol tri(meth)acrylate, pentaerythritol tetra(meth)acrylate, dipentaerythritol penta(meth)acrylate, dipentaerythritol hexa(meth)acrylate, and ε-caprolactone modified pentaerythritol hexaacrylate. Only one type of these compounds may be used alone, or two or more types may be used together.

The photopolymerizable compound preferably contains a phosphorus-containing compound (photopolymerizable phosphorus-containing compound). With the resin composition containing such a compound, flame retardancy of the cured product of the resin composition for a solder mask is improved. Examples of the photopolymerizable phosphorus-containing compound include 2-methacryloyloxyethyl acid phosphate (e.g., LIGHT ESTER P-1M and LIGHT ESTER P-2M (trade names) available from KYOEISHA CHEMICAL CO., LTD.), 2-acryloyloxyethyl acid phosphate (e.g., LIGHT ESTER P-1A (trade name) available from KYOEISHA CHEMICAL CO., LTD.), diphenyl-2-methacryloyloxyethyl phosphate (e.g., MR-260 (trade name) available from Daihachi Kogyo Co., Ltd.), HFA series available from Showa Highpolymer Co. Ltd. (e.g., HFA-6007 and HFA-6003 (trade names) that is an adduct of dipentaerythritol hexaacrylate and HCA, and HFA-6127 and HFA-3003 (trade names) that is an adduct of caprolactone modified dipentaerythritol hexaacrylate and HCA).

When the photopolymerizable compound is used, a percentage of photopolymerizable compound contained in the resin composition for a solder mask preferably falls within a range of 0.05 to 40 mass %, based on the total amount of the resin composition for a solder mask. Furthermore, the percentage of the photopolymerizable compound contained in the resin composition for a solder mask is preferably 50 mass % or less based on the total solid content of the resin composition for a solder mask. With the percentage of the photopolymerizable compound falling within any of the above ranges, it is possible to suppress excessive surface stickiness of a dry film made of the resin composition for a solder mask.

(5) Organic Solvent

The resin composition for a solder mask may contain an organic solvent, as requested. The organic solvent is used for the purpose of making the resin composition for a solder mask liquid or varnish and of adjusting viscosity, coating properties, and film-forming properties, and the like. Examples of the organic solvent include: straight chain or branched chain alcohols and secondary or polyvalent alcohols such as ethanol, propyl alcohol, isopropyl alcohol, hexanol, ethylene glycol; ketones such as methyl ethyl ketone and cyclohexanone; aromatic hydrocarbons such as toluene and xylene; a petroleum-type and aromatic-type mixed solvent such as swasol series available from MARUZEN PETROCHEMICAL CO., LTD and solvesso series available from EXXON MOBIL CHEMICAL CORPORATION; cellosolves such as cellosolve and butyl cellosolve; carbitols such as carbitol and butyl carbitol; propylene glycol alkyl ethers such as propylene glycol methyl ether; polypropylene glycol alkyl ethers such as dipropylene glycol methyl ether; esters of acetic acid such as ethyl acetate, butyl acetate, and cellosolve acetate; and dialkyl glycol ethers. Only one type of these may be used, or two or more types may be used together.

An organic solvent content of the resin composition for a solder mask is appropriately selected. The organic solvent content is preferably adjusted in such a manner that the organic solvent promptly volatilizes at preliminary dry for making a film of the resin composition for a solder mask, namely, in such a manner that the organic solvent does not remain in the dry film. The organic solvent content preferably falls within a range of 5 to 99.5 mass %, based on the total amount of the resin composition for a solder mask. With the organic solvent content falling within the range, retained are good coating properties of the resin composition for a solder mask and filling properties into a via hole or the like. Note that the preferable organic solvent content varies depending on an application method, a filling method, and the like, and therefore it is preferable that the organic solvent content is adjusted in accordance with the application method and the filling method.

(6) Additional Resin

The resin composition for a solder mask may further contain additional resin in addition to the aforementioned carboxyl-containing resin and epoxy compound unless the resin composition for a solder mask containing the additional resin cannot solve the technical problem of the present invention. The resin composition for masks may further contain: a heat curable component such as a blocked isocyanate (e.g., tolylene diisocyanate, morpholine diisocyanate, isophorone diisocyanate, and hexamethylene diisocyanate, which are blocked with caprolactam, oxime, malonic acid ester, or the like) and an amino resin (e.g., melamine, n-butylated melamine resin, isobutylated melamine resin, butylated urea resin, and butylated melamine urea condensation copolymer resin, and benzoguanamine-based condensation copolymer resin); ultraviolet curable epoxy (meth) acrylate; an adduct of (meth)acrylic acid to bisphenol A resin, phenol novolac resin, cresol novolac resin, alicyclic epoxy resin, or the like; and a polymer compound such as diallyl phthalate resin, phenoxy resin, melamine resin, urethane resin, and fluorine resin.

(7) Filler

The resin composition for a solder mask preferably contains filler. Examples of the filler include inorganic filler such as barium sulfate, crystalline silica, nano-silica, titanium oxide, carbon nanotube, talc, bentonite, aluminum hydroxide, and magnesium hydroxide. With containing such filler, a film made of the resin composition for a solder mask has a decreased cure shrinkage. A percentage of the filler in the resin composition for a solder mask is arbitrarily selected, but preferably falls within a range of 10 to 50 mass %. With the percentage falling within the range, the resin composition for a solder mask has an increased solid content, and therefore a change in volume is suppressed in heating the resin composition for a solder mask so as to be dried. Hence, the crack resistance of the cured product is furthermore improved.

(8) Others

As requested, the resin composition for a solder mask may contains: a curing agent for curing the epoxy compound; a curing accelerator, a colorant (e.g., a pigment), a copolymer (e.g., silicone and acrylate), a leveling agent, a tackifier (e.g., silane coupling agent), a thixotropic agent, a polymerization inhibitor, a halation preventing agent, a flame retardant, a defoamer, an antioxidant, a surfactant, a polymer dispersant, and the like as requested.

[Preparation of the Resin Composition for a Solder Mask]

The resin composition for a solder mask may be prepared by formulating components of raw materials (raw material components) as described above and kneading them by a known kneading method using triple roll mill, ball-mill, sand-mill, or the like. Some of the components (e.g., the photopolymerizable compound, part of the organic solvent, and the epoxy resin) may be mixed and dispersed, and the other components may be mixed and dispersed separately. In this case, the resin composition for a solder mask may be prepared by mixing them when used.

[Formation of a Solder Mask Layer]

The resin composition for a solder mask of the present embodiment may be used for forming a solder mask layer on the printed wiring board.

A first mode of a method of forming a solder mask layer on a printed wiring board from the resin composition for a solder mask of the present embodiment will be described below. According to the present mode, the solder mask layer is made of the resin composition for a solder mask having photosensitive and heat curable properties and is formed on the surface of the printed wiring board.

At first, a printed wiring board is prepared. The resin composition for a solder mask is applied onto a first surface of the printed wiring board, the first surface being perpendicular to the thickness direction. Thereafter, the resin composition is applied onto a second surface which is an opposite surface of the printed wiring board from the first surface. A method of applying the resin composition onto the surfaces may be an appropriate method such as an immersing method, spraying, spin coating, roll coating, curtain-coating, and screen-printing. Thereafter, preliminary drying is conducted to dry the resin compositions for a solder mask present on the first surface and the second surface of the printed wiring board. In the preliminary drying, the resin composition is heated at a temperature, for example, ranging from 60° C. to 120° C. so as to evaporate the organic solvent therefrom.

Subsequently, a negative mask with a pattern is disposed directly or indirectly on each of dried films of the resin compositions on the first surface and the second surface. Thereafter, the dried films of the resin composition are irradiated with active energy rays to expose the dried films to the rays with the negative masks. Examples of the negative mask include a photo tool such as a mask film and a dry plate. Such a photo tool has an exposing portion and a covering portion. The exposing portion has a pattern corresponding to a pattern of a desired solder mask layer and allows the active energy rays to pass. The covering portion is a portion of the photo tool other than the exposing portion, and blocks the active energy rays. Examples of the active energy rays include appropriate active energy rays such as ultraviolet light, visible light, and near infrared light, and the active energy rays are selected in accordance with constituents of the resin composition for a solder mask. Ultraviolet light or the like is emitted from a light source such as a chemical lamp, a low pressure mercury lamp, a middle pressure mercury lamp, a high pressure mercury lamp, an ultrahigh pressure mercury lamp, xenon lamp, and metal halide lamp, for example.

Note that an exposing method is not limited to the above method using the negative mask, but an appropriate method may be adopted. For example, a direct imaging method such as laser exposing may be adopted.

After exposing, the negative masks are detached from the printed wiring board, and development is conducted to remove unexposed portions of the resin composition for a solder mask. Exposed portions of the resin compositions remaining on the first and second surfaces of the printed wiring board are formed into the solder mask layers.

For the development, an appropriate developer may be used in accordance with a type of the resin composition for a solder mask. Examples of the developer include an alkaline solution such as a sodium carbonate aqueous solution, a potassium carbonate aqueous solution, an ammonium carbonate aqueous solution, a sodium bicarbonate aqueous solution, a potassium bicarbonate aqueous solution, an ammonium bicarbonate aqueous solution, a sodium hydroxide aqueous solution, a potassium hydroxide aqueous solution, an ammonium hydroxide aqueous solution, and a lithium hydroxide aqueous solution. Furthermore, examples of the developer include, in addition to the above alkaline solutions, organic amines such as monoethanolamine, diethanolamine, triethanolamine, monoisopropanolamine, diisopropanolamine, and triisopropanolamine. One type of these may be used alone, or two or more types may be used together. The solvent of the alkaline solution may be water or a mixture of water and a hydrophilic organic solvent (e.g., lower alcohols).

Furthermore, the solder mask layer and a cured product inside a through-hole are subjected to heat treatment (e.g., heated at 120° C. to 180° C. for about 30 to about 90 min) to promote a heat curing reaction in the solder mask layer. Accordingly, strength, hardness, chemical resistance, and the like of the solder mask layer are improved.

Note that in the present mode, the resin compositions on the first surface and the second surface are subjected to exposure and development at one time after application of the resin composition for a solder mask onto each of the first surface and second surface. However, timing for the exposure and development is not limited to this. For example, the resin composition for a solder mask is applied onto the first surface and subsequently the resin composition on the first surface may be subjected to exposure and development before application of the resin composition for a solder mask onto the second surface. Thereafter, the resin composition for a solder mask may be applied on the second surface and the resin composition on the second surface may be subjected to exposure and development.

Next, a second mode of the method of forming a solder mask layer on a printed wiring board will be described. In the present mode, the solder mask layer is made of the resin composition for a solder mask having heat curable properties and is formed on a surface of the printed wiring board.

At first, a printed wiring board is prepared. The resin composition for a solder mask is applied onto a first surface of the printed wiring board so as to form a patterned film of the resin composition for a solder mask, the first surface being perpendicular to the thickness direction. Thereafter, the resin composition for a solder mask is also applied onto a second surface which is an opposite surface of the printed wiring board from the first surface so as to form a patterned film of the resin composition. A method of applying the resin composition for a solder mask may be an appropriate method such as screen-printing.

Thereafter, preliminary drying for evaporating the organic solvent of the resin composition for a solder mask is conducted at a temperature, for example, ranging from 60° C. to 120° C. to make the resin compositions dry on the first and second surfaces.

Subsequently, the resin compositions on the first and second surfaces of the printed wiring board are subjected to heat treatment (e.g., heated at 120° C. to 180° C. for 30 to 90 min) to promote a heat curing reaction in the resin composition. Accordingly, the resin compositions on the first and second surfaces are cured to be formed into solder mask layers.

Note that in the present aspect, the resin compositions on the first and second surfaces are cured by means of heating at one time after application of the resin composition onto the first and second surfaces. However, timing for heating is not limited to this. For example, the resin composition for a solder mask is applied onto the first surface and then the resin composition on the first surface may be heated before application of the resin composition for a solder mask onto the second surface. Thereafter, the resin composition for a solder mask may be applied onto the second surface and then the resin composition on the second surface may be heated.

EXAMPLES

Synthetic Example A-1

A reflux condenser, a thermometer, an air bleed tube, and a stirrer were set to a four-necked flask. Into the four-necked flask, 288 parts by mass of a biphenyl novolac epoxy resin (NC-3000-H (trade name) available from NIPPON KAYAKU CO., Ltd., epoxy equivalent weight: 288), 155 parts by mass of diethylene glycol monoethyl ether acetate, 0.2 parts by mass of methylhydroquinone, 22.0 parts by mass of acrylic acid, and 3 parts by mass of triphenyl phosphine were added to prepare a mixture. The mixture was heated at 100° C. for 3 hours in the flask.

Subsequently, to the resultant mixture in the flask, added were 119 parts by mass of tetrahydrophthalic acid, 0.3 parts by mass of methylhydroquinone, and 78.2 parts by mass of diethylene glycol monoethyl ether acetate. Then, thus-obtained mixture was heated at 90° C. for 10 hours.

Consequently, a 65 mass % solution of a carboxyl-containing resin (A-1) was obtained. This carboxyl-containing resin has an acid value of 67 mg KOH/g, an epoxy equivalent weight of about 7700 g/eq, and a weight average molecular weight of about 8000.

Synthetic Example A-2

A reflux condenser, a thermometer, an air bleed tube, and a stirrer were set to a four-necked flask. Into the four-necked flask, 276 parts by mass of a biphenyl novolac epoxy resin (NC-3000 (trade name) available from NIPPON KAYAKU CO., Ltd., epoxy equivalent weight: 276), 155 parts by mass of diethylene glycol monoethyl ether acetate, 0.2 parts by mass of methylhydroquinone, 22.0 parts by mass of acrylic acid, and 3 parts by mass of triphenyl phosphine were added to prepare a mixture. The mixture was heated at 100° C. for 3 hours in the flask.

Subsequently, to the resultant mixture in the flask, added were 119 parts by mass of tetrahydrophthalic acid, 0.3 parts by mass of methylhydroquinone, and 71.4 parts by mass of diethylene glycol monoethyl ether acetate. Then, thus-obtained mixture was heated at 90° C. for 17 hours.

Consequently, a 65 mass % solution of a carboxyl-containing resin (A-2) was obtained. This carboxyl-containing resin has an acid value of 70 mg KOH/g, an epoxy equivalent weight of about 15200 g/eq, and a weight average molecular weight of about 4600.

Synthetic Example A-3

A reflux condenser, a thermometer, an air bleed tube, and a stirrer were set to a four-necked flask. Into the four-necked flask, 276 parts by mass of a biphenyl novolac epoxy resin (NC-3000 (trade name) available from NIPPON KAYAKU CO., Ltd., epoxy equivalent weight: 276), 155 parts by mass of diethylene glycol monoethyl ether acetate, 0.2 parts by mass of methylhydroquinone, 22.0 parts by mass of acrylic acid, and 3 parts by mass of triphenyl phosphine were added to prepare a mixture. The mixture was heated at 100° C. for 3 hours in the flask.

Subsequently, to the resultant mixture in the flask, added were 59.5 parts by mass of tetrahydrophthalic acid, 34.8 parts by mass of maleic acid, 0.3 parts by mass of methylhydroquinone, and 58.1 parts by mass of diethylene glycol monoethyl ether acetate. Then, thus-obtained mixture was heated at 90° C. for 17 hours.

Consequently, a 65 mass % solution of a carboxyl-containing resin (A-3) was obtained. This carboxyl-containing resin has an acid value of 85 mg KOH/g, an epoxy equivalent weight of about 18000 g/eq, and a weight average molecular weight of about 4000.

Synthetic Example A-4

A reflux condenser, a thermometer, an air bleed tube, and a stirrer were set to a four-necked flask. Into the four-necked flask, 276 parts by mass of a biphenyl novolac epoxy resin (NC-3000 (trade name) available from NIPPON KAYAKU CO., Ltd., epoxy equivalent weight: 276), 155 parts by mass of diethylene glycol monoethyl ether acetate, 0.2 parts by mass of methylhydroquinone, 14.7 parts by mass of acrylic acid, 30 parts by mass of ω-carboxy-polycaprolactone (n≈2) monoacrylate (Aronix M-5300 (trade name) available from TOAGOSEI CO., LTD., the number average molecular weight: 290), and 3 parts by mass of triphenyl phosphine were added to prepare a mixture. The mixture was heated at 100° C. for 3 hours in the flask.

Subsequently, to the resultant mixture in the flask, added were 119 parts by mass of tetrahydrophthalic acid, 0.3 parts by mass of methylhydroquinone, and 83.6 parts by mass of diethylene glycol monoethyl ether acetate. Then, thus-obtained mixture was heated at 90° C. for 10 hours.

Consequently, a 65 mass % solution of a carboxyl-containing resin (A-4) was obtained. This carboxyl-containing resin has an acid value of 68 mg KOH/g, an epoxy equivalent weight of about 5300 g/eq, and a weight average molecular weight of about 4300.

Synthetic Example A-5

A reflux condenser, a thermometer, an air bleed tube, and a stirrer were set to a four-necked flask. Into the four-necked flask, 276 parts by mass of a biphenyl novolac epoxy resin (NC-3000 (trade name) available from NIPPON KAYAKU CO., Ltd., epoxy equivalent weight: 276), 155 parts by mass of diethylene glycol monoethyl ether acetate, 0.2 parts by mass of methylhydroquinone, 18 parts by mass of acetic acid, and 3 parts by mass of triphenyl phosphine were added to prepare a mixture. The mixture was heated at 100° C. for 3 hours in the flask.

Subsequently, into the resultant mixture in the flask, added were 119 parts by mass of tetrahydrophthalic acid, 0.3 parts by mass of methylhydroquinone, and 69.3 parts by mass of diethylene glycol monoethyl ether acetate. Then, thus-obtained mixture was heated at 90° C. for 15 hours.

Consequently, a 65 mass % solution of a carboxyl-containing resin (A-5) was obtained. This carboxyl-containing resin has an acid value of 68 mg KOH/g, an epoxy equivalent weight of about 8100 g/eq, and a weight average molecular weight of about 7800.

Synthetic Example A-6

A reflux condenser, a thermometer, an air bleed tube, and a stirrer were set to a four-necked flask. Into the four-necked flask, 276 parts by mass of a biphenyl novolac epoxy resin (NC-3000 (trade name) available from NIPPON KAYAKU CO., Ltd., epoxy equivalent weight: 276), 242 parts by mass of diethylene glycol monoethyl ether acetate, 0.5 parts by mass of methylhydroquinone, 3 parts by mass of triphenyl phosphine, and 170 parts by mass of tetrahydrophthalic acid were added to prepare a mixture. The mixture was heated at 90° C. for 10 hours in the flask.

Consequently, a 65 mass % solution of a carboxyl-containing resin (A-6) was obtained. This carboxyl-containing resin has an acid value of 81 mg KOH/g, an epoxy equivalent weight of about 7000 g/eq, and a weight average molecular weight of about 5600.

Synthetic Example B-1

A reflux condenser, a thermometer, an air bleed tube, and a stirrer were set to a four-necked flask. Into the four-necked flask, 203 parts by mass of a cresol novolac epoxy resin (YDCN-700-5 (trade name) available from NIPPON STEEL CHEMICAL CO., LTD., epoxy equivalent weight: 203), 153.2 parts by mass of diethylene glycol monoethyl ether acetate, 0.2 parts by mass of methylhydroquinone, 43.2 parts by mass of acrylic acid, and 3 parts by mass of triphenyl phosphine were added to prepare a mixture. The mixture was heated at 100° C. for 3 hours in the flask.

Subsequently, into the resultant mixture in the flask, 34.8 parts by mass of maleic acid and 0.3 parts by mass of methylhydroquinone were added. Then, thus-obtained mixture was heated at 100° C. for 6 hours. As a result, the mixture gelled.

Consequently, a gel-like mixture (B-1) was obtained.

Synthetic Example B-2

A reflux condenser, a thermometer, an air bleed tube, and a stirrer were set to a four-necked flask. Into the four-necked flask, 188 parts by mass of a phenol novolac epoxy resin (EPICLON N-775 (trade name) available from DIC Corporation, epoxy equivalent weight: 188), 194.7 parts by mass of diethylene glycol monoethyl ether acetate, 0.5 parts by mass of methylhydroquinone, 3 parts by mass of triphenyl phosphine, and 170 parts by mass of tetrahydrophthalic acid were added to prepare a mixture. The mixture was heated at 100° C. for 6 hours. As a result, the mixture gelled.

Consequently, a gel-like mixture (B-2) was obtained.

Synthetic Example B-3

A reflux condenser, a thermometer, an air bleed tube, and a stirrer were set to a four-necked flask. Into the four-necked flask, 203 parts by mass of a cresol novolac epoxy resin (YDCN-700-5 (trade name) available from NIPPON STEEL CHEMICAL CO., LTD., epoxy equivalent weight: 203), 160.1 parts by mass of diethylene glycol monoethyl ether acetate, 0.2 parts by mass of methylhydroquinone, 36 parts by mass of acrylic acid, and 3 parts by mass of triphenyl phosphine were added to prepare a mixture. The mixture was heated at 110° C. for 3 hours in the flask.

Subsequently, 46.4 parts by mass of maleic acid and 0.3 parts by mass of methylhydroquinone were added into the resultant mixture in the flask, followed by heating at 100° C. for 2 hours. Then, 8.4 parts by mass of acetic acid was added into thus-obtained mixture, followed by heating at 100° C. for 4 hours.

Consequently, a 65 mass % solution of a carboxyl-containing resin (B-3) was obtained. The carboxyl-containing resin has an epoxy equivalent weight of about 9800 g/eq.

Synthetic Example B-4

A reflux condenser, a thermometer, an air bleed tube, and a stirrer were set to a four-necked flask. Into the four-necked flask, 203 parts by mass of a cresol novolac epoxy resin (YDCN-700-5 (trade name) available from NIPPON STEEL CHEMICAL CO., LTD., epoxy equivalent weight: 203), 103 parts by mass of diethylene glycol monoethyl ether acetate, 0.2 parts by mass of hydroquinone, 72.7 parts by mass of acrylic acid, and 0.6 parts by mass of dimethylbenzylamine were added to prepare a mixture. The mixture was heated at 100° C. for 10 hours in the flask.

Subsequently, into the resultant mixture in the flask, 60.8 parts by mass of tetrahydrophthalic acid anhydride and 78.9 parts by mass of diethylene glycol monoethyl ether acetate were added. Thus-obtained mixture was heated at 81° C. for 3 hours.

Consequently, a 65 mass % solution of a carboxyl-containing resin (B-4) was obtained.

[Preparation of a Resin Composition for a Solder Mask]

With regard to each of Examples and Comparative Examples, raw materials listed in following Tables were blended according to corresponding proportions shown in these Tables, and the resultant blend was kneaded with a triple roll mil, and thus a resin composition for a solder mask was prepared.

The resin solutions A-1 to A-6, B-3, and B-4 shown in Tables are the solutions of the carboxyl-containing resins obtained in synthetic examples A-1 to A-6, B-3, and B-4, respectively. Note that the mixtures obtained in synthetic examples B-1 and B-2 are gels, and therefore are not used for preparing a resin composition for a solder mask.

Note that details of the components on Tables will be described as follows.

Epoxy compound A: Biphenyl epoxy resin (trade name: YX4000) available from Mitsubishi Chemical Corporation Epoxy compound B: Biphenyl novolac epoxy resin (trade name: NC-3000-H) available from NIPPON KAYAKU CO., Ltd Photopolymerizable monomer: Dipentaerythritol hexaacrylate modified with two caprolactones per molecule (trade name: DPCA-20) available from NIPPON KAYAKU CO., Ltd Photopolymerization initiator A: 2,4,6-Trimethylbenzoyl-diphenylphosphine oxide (trade name: LUCIRIN TPO) available from BASF corporation Photopolymerization initiator B: 1-Hydroxy-cyclohexyl-phenyl-ketone (trade name: IRGACURE 184) available from CIBA JAPAN K.K.

Photopolymerization initiator C: Ethanone, 1-[9-Ethyl-6-(2-methylbenzoyl)-9H-carbazol-3-yl]ethanone O-acetyl oxime (trade name: IRGACURE OXE 02) available from CIBA JAPAN K.K.

Filler A: Barium sulfate (trade name: BARIACE B30) available from SAKAI CHEMICAL INDUSTRY CO., LTD.

Filler B: Talc (trade name: SG-2000) available from Nippon Talc Co., Ltd.

Melamine resin: Melamine HM (trade name) available from NISSAN CHEMICAL INDUSTRIES, LTD.

Defoamer: Simethicone (mixture of dimethicone and silicic acid, trade name: KS-66) available from Shin-Etsu Chemical Co., Ltd.

Colorant: Phthalocyanine green

Organic solvent: Diethylene glycol monoethyl ether acetate

[Evaluation Test]

(Preparation of Test Pieces for Examples 1 to 6 and Comparative Examples 1 and 2)

A copper-clad glass-epoxy laminate with cupper foil having a thickness of 35 µm was subjected to etching for patterning the cupper foil. Accordingly, a printed wiring board was prepared. Onto an entire face of the printed wiring board, the resin composition for a solder mask was applied by screen printing to form a wet film on the printed wiring board. The wet film was preliminary dried by heating at 80° C. for 20 min to form a dried film with the thickness of 20 µm. A negative mask was disposed directly on a surface of the dried film, and the dried film was irradiated with ultraviolet radiation at an amount of which is equal to an appropriate exposure amount for the resin composition for a solder mask. Accordingly, the dried film was selectively exposed to light. After the exposure, the dried film was subjected to development with a sodium carbonate solution, and thus cured parts (cured film) of the dried film, which cured by the exposure, were left on the printed wiring board.

Subsequently, this cured film was further heated at 150° C. for 60 min so as to be heat cured and then irradiated with ultraviolet radiation having an energy density of 1000 mJ/cm$^2$. Consequently, a solder mask layer was formed on the printed wiring board. A set of the printed wiring board and the solder mask layer thereon was used as a test piece.

(Preparation of Test Pieces for Examples 7 to 9 and Comparative Examples 3 and 4)

A copper-clad epoxy-glass laminate with cupper foil having a thickness of 35 µm was subjected to etching for patterning the cupper foil. Accordingly, a printed wiring board was prepared. Onto the printed wiring board, the resin composition for a solder mask was applied by screen printing in a patterned manner to form a patterned wet film with a thickness of 30 µm on the printed wiring board. The wet film was preliminary dried by heating at 80° C. for 20 min and then heated at 150° C. for 60 min so as to be heat cured. Consequently, a solder mask layer was formed on the printed wiring board. A set of the printed wiring board and the solder mask layer thereon was used as a test piece.

(Acid Resistance)

Appearance of the test piece was visually examined after immersion of the test piece into a 10% sulfuric acid aqueous solution for 30 min at room temperature. The results were classified into the following ratings.

A: No evidence of damage is observed

B: Little damage is observed

C: A little damage is observed

D: Great damage such as flaking of the solder mask layer is observed (Alkaline Resistance)

Appearance of the test piece was visually examined after immersion of the test piece into a 10% sodium hydroxide aqueous solution for 1 hour at room temperature. The results were classified into the following ratings.

A: No evidence of damage is observed

B: Little damage is observed

C: A little damage is observed

D: Great damage such as flaking of the solder mask layer is observed (Adhesion)

According to the test method of JIS D0202, the solder mask layer of the test piece was cross-cut in a grid manner to make cross-cut sections on the surface and subsequently the peeling state thereof was visually examined after the peeling test with a cellophane adhesive tape. The results were classified into the following ratings.

A: None of the 100 cross-cut sections is changed.

B: One of the 100 cross-cut sections is slightly lifted.

C: Two to ten of the 100 cross-cut sections are removed.

D: 11 to 100 of the 100 cross-cut sections are removed.

(Resistance to Plating)

The test piece was subjected to plating using an electroless nickel-plating bath and an electroless gold plating bath which were commercially available. The state of the plate was observed. Moreover, regarding the solder mask layer after the plating, the peeling test with a cellophane adhesive tape was conducted. The results were classified into the following ratings.

A: There is no change in appearance, no peeling of the solder mask layer in peeling the tape off, and no intrusion of the plating between the solder mask layer and the printed wiring board.

B: There is no change in appearance and no peeling of the solder mask layer, but extremely a little intrusion of the plating is observed between an end of the solder mask layer and the printed wiring board.

C: There is no change in appearance but partial peeling of the solder mask layer is observed after the tape is peeled off.

D: Lift of the solder mask layer is observed, and peeling of the solder mask layer is observed after the tape is peeled off.

(Solder Heat Resistance)

A water-soluble flux (LONCO 3355-11 (trade name) available from LONDON Chemical Co., Ltd.) was applied onto the test piece, and thus-obtained piece was immersed into a molten solder bath at 260° C. for 10 seconds, followed by washing with water. Appearance of the solder mask layer after repeating this cycle three times was examined. The results were classified into the following ratings.

A: No evidence of damage is observed

B: Little damage is observed

C: A little damage is observed

D: Great damage such as peeling of the solder mask layer is observed (Pencil Hardness)

The pencil hardness of the solder mask layer of each test piece was measured according to JIS K5400 with using Mitsubishi high-uni (available from Mitsubishi Pencil Co., Ltd).

(Flexibility)

Regarding each of Examples 1 to 6 and Comparative Examples 1 and 2, the resin composition for a solder mask was applied onto an entire face of a polyester film by screen printing to form a wet film on the polyester film. The wet film was preliminary dried by heating at 80° C. for 20 min to form a dried film with the thickness of 20 μm. The whole dried film was irradiated with ultraviolet radiation at an amount of which is equal to an approximate exposure amount for the resin composition for a solder mask, and thus a cured film was prepared. The cured film was further heated at 150° C. for 60 min so as to be heat cured and then irradiated with ultraviolet radiation having an energy density of 1000 mJ/cm$^2$. Thereafter, the cured film was peeled off from the polyester film.

Regarding each of Examples 7 to 9 and Comparative Examples 3 and 4, the resin composition for a solder mask was applied onto an entire face of a polyester film by screen printing to form a wet film on the polyester film with the thickness of 30 μm. The wet film was preliminary dried by heating at 80° C. for 20 min, and subsequently heat cured by application of heat at 150° C. for 60 min. Accordingly, a cured film was formed on the polyester film, and thereafter peeled off from the polyester film.

Each of the cured films obtained according to Examples and Comparative Examples was cut into specimens each having a planar size of 5 cm and a depth of 2 cm. These specimens were bent at 160 degrees, 165 degrees, and 170 degrees, respectively, and the appearances of the resultant specimens were observed. The results were classified into the following ratings.

A: No break is observed after bending at 170 degrees

B: A break is observed after bending at 170 degrees, but no break is observed when bending at 165 degrees C: A break is observed after bending at 165 degrees, but no break is observed after bending at 160 degrees D: A break is observed even after bending at 160 degrees.

(PCT Resistance)

The test piece was exposed to conditions (121° C. and 97% R. H.) for 100 hours, and thereafter appearance thereof was examined. The results were classified into the following ratings.

A: No blister, no peeling, and no change in color is observed in the solder mask layer B: No blister, and no peeling is observed but a few changes in color are observed in the solder mask layer C: A few blisters, peelings, and changes in color are observed in the solder mask layer D: Blisters, peelings, and changes in color are observed in the solder mask layer (Electrical Insulation Reliability)

A printed wiring board for evaluation was prepared by forming interdigitated electrodes with a line width of 100 μm and a pitch of 100 μm on a cupper-clad laminate (FR-4). On the resultant printed wiring board, a solder mask layer was formed in the same manner and under the same conditions as those for the test piece. Thereafter, a bias voltage of 30 V DC was applied between the interdigitated electrodes while thus-obtained printed wiring board was exposed to test conditions (121° C. and 97% R.H.) for 200 hours. The electrical resistance of the solder mask layer was measured continuously during the period of the test. The results were classified into the following ratings.

A: The electrical resistance is $10^6\Omega$ or more throughout a duration of 200 hours from the start time of the test B: The electrical resistance falls below $10^6\Omega$ in a duration of 150 hours or more and less than 200 hours from the start time of the test, but is $10^6\Omega$ or more until the falling C: The electrical resistance falls below $10^6\Omega$ in a duration of 100 hours or more and less than 150 hours from the start time of the test, but is $10^6\Omega$ or more until the falling D: The electrical resistance falls below $10^6\Omega$ in a duration of less than 100 hours from the start time of the test (Resolution)

In the above process of preparing the test pieces for Examples 1 to 6 and Comparative Examples 1 and 2, treatment using a negative mask with a negative pattern having individual openings of diameters 60 μm, 70 μm, 80 μm, and 90 μm was conducted to form individual openings with diameters of 60 μm, 70 μm, 80 μm, and 90 μm in the solder mask layer.

The solder mask layer was observed, and the results were classified into the following ratings.

A: All openings having diameters of 60 to 90 μm are made.

B: Openings having diameters of 70 to 90 μm are made, but an opening having a diameter of 60 μm is not made.

C: Openings having diameters of 80 μm and 90 μm are made, but openings having diameters of not more than 70 μm are not made.

D: Openings having diameters of not less than 80 μm are not made.

TABLE 1

|  |  | Ex. 1 | Ex. 2 | Ex. 3 | Ex. 4 | Ex. 5 | Ex. 6 | Com. Ex. 1 | Com. Ex. 2 |
|---|---|---|---|---|---|---|---|---|---|
| Composition (parts by mass) | Resin solution A-1 | 154 |  |  |  |  |  |  |  |
|  | Resin solution A-2 |  | 154 |  |  |  |  |  |  |
|  | Resin solution A-3 |  |  | 154 |  |  |  |  |  |
|  | Resin solution A-4 |  |  |  | 154 |  |  |  |  |
|  | Resin solution A-5 |  |  |  |  | 154 |  |  |  |
|  | Resin solution A-6 |  |  |  |  |  | 154 |  |  |
|  | Resin solution B-3 |  |  |  |  |  |  | 154 |  |
|  | Resin solution B-4 |  |  |  |  |  |  |  | 154 |
|  | Epoxy compound A | 35 | 35 | 35 | 35 | 35 | 35 | 35 | 35 |
|  | Epoxy compound B | 20 | 20 | 20 | 20 | 20 | 20 | 20 | 20 |
|  | Photopolymerizable monomer | 23 | 23 | 23 | 23 | 30 | 30 | 23 | 23 |
|  | Photopolymerization initiator A | 8 | 8 | 8 | 8 | 8 | 8 | 8 | 8 |
|  | Photopolymerization initiator B | 2 | 2 | 2 | 2 | 2 | 2 | 2 | 2 |
|  | Photopolymerization initiator C | 0.5 | 0.5 | 0.5 | 0.5 | 0.5 | 0.5 | 0.5 | 0.5 |
|  | Filler A | 25 | 25 | 25 | 25 | 25 | 25 | 25 | 25 |
|  | Filler B | 25 | 25 | 25 | 25 | 25 | 25 | 25 | 25 |
|  | Melamine resin | 3 | 3 | 3 | 3 | 3 | 3 | 3 | 3 |
|  | Defoamer | 3 | 3 | 3 | 3 | 3 | 3 | 3 | 3 |
|  | Colorant | 1 | 1 | 1 | 1 | 1 | 1 | 1 | 1 |
|  | Organic solvent | 14 | 12 | 12 | 12 | 12 | 12 | 12 | 12 |
| Evaluation | Acid resistance | A | A | A | A | A | A | A | C |
|  | Alkaline resistance | A | A | A | A | A | A | A | A |
|  | Adhesion | A | A | A | A | A | A | A | A |
|  | Resistance to plating | A | A | A | A | A | A | B | B |
|  | Solder heat resistance | A | A | A | A | A | A | A | A |
|  | Pencil hardness | 4H | 4H | 4H | 4H | 4H | 4H | 5H | 5H |
|  | Flexibility | A | A | A | A | A | A | A | D |
|  | PCT resistance | A | A | A | A | A | A | B | D |
|  | Electrical insulation reliability | A | A | A | A | A | B | D | D |
|  | Resolution | A | A | A | A | B | C | D | D |

TABLE 2

|  |  | Ex. 7 | Ex. 8 | Ex. 9 | Com. Ex. 3 | Com. Ex. 4 |
|---|---|---|---|---|---|---|
| Composition (parts by mass) | Resin solution A-1 | 154 |  |  |  |  |
|  | Resin solution A-2 |  |  |  |  |  |
|  | Resin solution A-3 |  |  |  |  |  |
|  | Resin solution A-4 |  |  |  |  |  |
|  | Resin solution A-5 |  | 154 |  |  |  |
|  | Resin solution A-6 |  |  | 154 |  |  |
|  | Resin solution B-3 |  |  |  | 154 |  |
|  | Resin solution B-4 |  |  |  |  | 154 |
|  | Epoxy compound A | 45 | 45 | 45 | 45 | 45 |
|  | Epoxy compound B | 13 | 13 | 13 | 13 | 13 |
|  | Photopolymerizable monomer |  |  |  |  |  |
|  | Photopolymerization initiator A |  |  |  |  |  |
|  | Photopolymerization initiator B |  |  |  |  |  |
|  | Photopolymerization initiator C |  |  |  |  |  |
|  | Filler A | 25 | 25 | 25 | 25 | 25 |
|  | Filler B | 25 | 25 | 25 | 25 | 25 |
|  | Melamine resin | 3 | 3 | 3 | 3 | 3 |
|  | Defoamer | 3 | 3 | 3 | 3 | 3 |
|  | Colorant | 1 | 1 | 1 | 1 | 1 |
|  | Organic solvent | 16 | 16 | 16 | 16 | 16 |
| Evaluation | Acid resistance | A | A | A | A | C |
|  | Alkaline resistance | A | A | A | A | A |
|  | Adhesion | A | A | A | A | A |
|  | Resistance to plating | A | A | A | A | A |
|  | Solder heat resistance | A | A | A | A | A |
|  | Pencil hardness | 5H | 5H | 5H | 6H | 6H |
|  | Flexibility | A | A | A | A | D |
|  | PCT resistance | A | A | A | B | D |
|  | Electrical insulation reliability | A | A | A | D | D |

The invention claimed is:

1. A carboxyl-containing resin comprising
   a structure resulting from addition of a carboxylic acid to at least one of epoxy groups of a biphenyl novolac epoxy resin,
   the carboxylic acid including a polybasic acid,
   wherein the carboxylic acid further includes a monocarboxylic acid.

2. The carboxyl-containing resin according to claim 1, wherein
   the monocarboxylic acid includes an ethylenically unsaturated group-containing monocarboxylic acid.

3. A resin composition for a solder mask comprising the carboxyl-containing resin according to claim 2.

4. The resin composition for a solder mask according to claim 3, further comprising a photopolymerization initiator.

5. The resin composition for a solder mask according to claim 3, further comprising at least one type of photopolymerizable compound selected from a group consisting of a photopolymerizable monomer and a photopolymerizable prepolymer.

6. The resin composition for a solder mask according to claim 5, further comprising
an epoxy compound having at least two epoxy groups per molecule.

7. The resin composition for a solder mask according to claim 3, further comprising
an epoxy compound having at least two epoxy groups per molecule.

8. A resin composition for a solder mask comprising the carboxyl-containing resin according to claim 1.

9. The resin composition for a solder mask according to claim 8, further comprising
an epoxy compound having at least two epoxy groups per molecule.

10. A method of preparing a carboxyl-containing resin comprising:
preparing a biphenyl novolac epoxy resin; and
adding a carboxylic acid including a polybasic acid to at least one of epoxy groups of the biphenyl novolac epoxy resin to produce the carboxyl-containing resin,
wherein the carboxylic acid further includes a monocarboxylic acid.

* * * * *